United States Patent [19]

Hendricks

[11] Patent Number: 4,927,001

[45] Date of Patent: May 22, 1990

[54] ADJUSTABLE COMPONENT COVER PLATE FOR VIBRATING CONVEYOR

[75] Inventor: Ross D. Hendricks, Palos Verdes Peninsula, Calif.

[73] Assignee: Excellon Automation, Torrance, Calif.

[21] Appl. No.: 157,930

[22] Filed: Feb. 19, 1988

[51] Int. Cl.⁵ .............................................. B65G 47/00
[52] U.S. Cl. .................................. 198/463.5; 198/771; 221/307
[58] Field of Search ............ 198/391, 420, 421, 463.5, 198/468.2, 468.4, 468.5, 771, 432; 414/403, 404, 415; 29/832, 834, 837, 838, 809; 221/307, 309

[56] References Cited

U.S. PATENT DOCUMENTS

| | | |
|---|---|---|
| 1,495,610 | 5/1924 | Paridon . |
| 2,164,676 | 7/1939 | Appleyard et al. . |
| 2,739,696 | 3/1956 | Heide ................................ 198/463.5 |
| 2,840,090 | 6/1958 | Bradford . |
| 3,854,610 | 12/1974 | Carder . |
| 3,958,687 | 5/1976 | Adams et al. . |
| 4,042,100 | 8/1977 | Morrone . |
| 4,168,772 | 9/1979 | Eberle ................................... 198/421 |
| 4,444,303 | 4/1984 | Burgess, Jr. . |
| 4,492,297 | 1/1985 | Sticht . |
| 4,567,652 | 2/1986 | Gussman et al. ...................... 29/837 |
| 4,601,382 | 7/1986 | Roberts et al. .................... 198/463.5 |

Primary Examiner—Joseph E. Valenza
Attorney, Agent, or Firm—Knobbe, Martens, Olson & Bear

[57] ABSTRACT

An apparatus for maintaining the orientation of a plurality of components advancing toward a first location comprises a trough, secured to a vibrating feed tray, and a component cover plate for preventing the components from being canted within the trough. The cover plate exhibits a flap which at least partially overhangs a component disposed at the first location. The flap is adapted to have a flexibility sufficient to allow the component to be lifted from the tray, yet have a rigidity which prevents the component from canting at the first location.

15 Claims, 2 Drawing Sheets

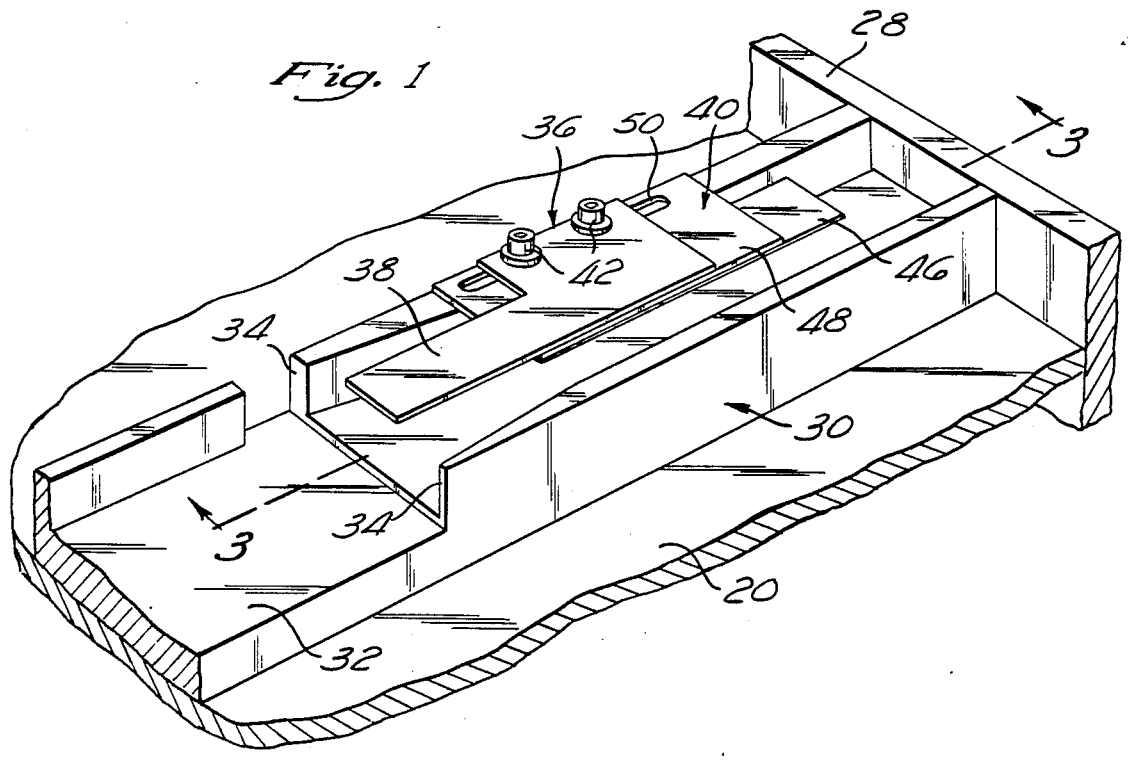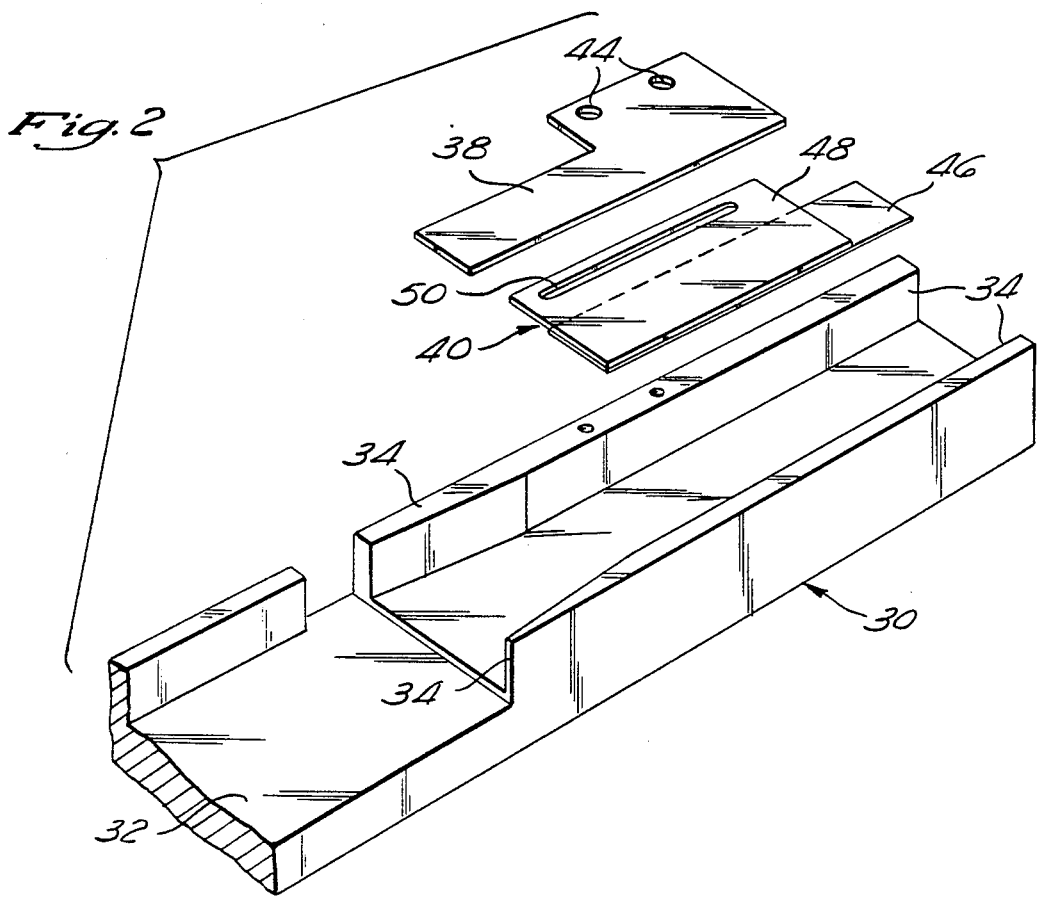

ADJUSTABLE COMPONENT COVER PLATE FOR VIBRATING CONVEYOR

BACKGROUND OF THE INVENTION

The present invention relates generally to the field of vibrating conveyors, and in particular to parts feeders for feeding electronic components to "pick and place" machines which automatically surface mount such components on, for example, a printed circuit board.

The assembly of surface mounted printed circuit boards requires the placement of a wide variety and large number of small electronic components on the surface of the board in precisely located, predetermined positions. The repetitive nature of this task has led to the development of computer controlled, automatic "pick and place" machines which pick electronic components from a "pick" station, move the component to the printed circuit board, and "place" the component at a precisely defined, predetermined location on the circuit board.

To maintain a steady supply of components at the "pick" station, like components are packaged in elongate, open ended tubes. A plurality of tubes, each containing different components, are mounted on a vibrating feed tray such that the components are advanced out of the tubes. In order to guide the components to their respective "pick" station, channels or troughs must be provided on the tray. These channels or troughs must be properly dimensioned so as to ensure that the components are oriented in a predictable fashion upon arrival at the "pick" station.

Vibration of the tray causes the components to advance toward the end of the tray. Arriving at the end of the tray, the components butt against a stop plate, and is held in position until it is subsequently lifted from the tray. The continued vibration of the tray, after a component has arrived at the "pick" station and a plurality of components lined up within the trough behind it, has a tendency to disrupt the orientation of these components, and can cause them to be canted so as to stand up on end, as opposed to laying flat, as shown in FIG. 4. Such canting, sometimes called "tombstoning," can prevent the component from being lifted from the tray or if it is lifted, it will not be properly placed on the printed circuit board.

Accordingly, there is a need in the art for an apparatus which would ensure and maintain proper orientation of the components as they travel down the troughs and arrive at their respective "pick" station.

SUMMARY OF THE INVENTION

Briefly, the present invention is a device for maintaining the orientation of a plurality of components advancing on a conveyor, and is adapted to allowing the components to be lifted while still being restrained from "tombstoning." In a preferred embodiment, the apparatus comprises a feed tray, having a trough secured thereto and an adjustable component cover, removably secured to the trough.

Advantageously, components to be fed to the trough are encased in substantially rectangular plastic shipping tubes, prearranged in the desired orientation so as to provide a continuous supply of components to the respective "pick" stations. These tubes are inserted into one end of the trough, while the free end of the tubes are supported in an inclined, ski-slope manner by a tube bracket support.

As the components advance toward their respective "pick" stations, they are funneled between a pair of aligning walls which taper and narrow so as to center the component within the trough. Arriving at the bottom of the trough, the component abuts a stop plate and is held in place within the trough until it is subsequently lifted from the trough. A component cover plate, removably secured to one of the aligning walls at least partially covers the portion of the trough along which the components are exposed, to prevent the components from "tombstoning."

Preferably, the component cover plate consists of two parts. First, a fixed washer plate, which is attached to a wall of a trough by screws and washers. Sandwiched between the trough and the washer plate is the second part, a sliding cover. The sliding cover is made of two pieces: a relatively stiff backing plate and a relatively flexible flap, bonded to the backing plate. The flap protrudes from underneath the backing plate to provide resistance to "tombstoning," yet is flexible enough to give way when the component is lifted from the trough.

The flap partially overhangs a component when the component reaches its final position at the stop plate, prior to being removed from the trough. The amount of overhang is adjustable for different sized components, thus allowing one adjustable component cover plate to be used for many sizes of components. In the preferred embodiment, the backing plate and fixed washer plate are made of metal, and the flap is of plastic.

BRIEF DESCRIPTION OF THE DRAWINGS

FIG. 1 is a perspective view of the component cover plate of the present invention, mounted on a conventional feed trough;

FIG. 2 is an exploded perspective view of the component cover plate of the present invention;

DETAILED DESCRIPTION OF THE PREFERRED EMBODIMENT

Figure 5:
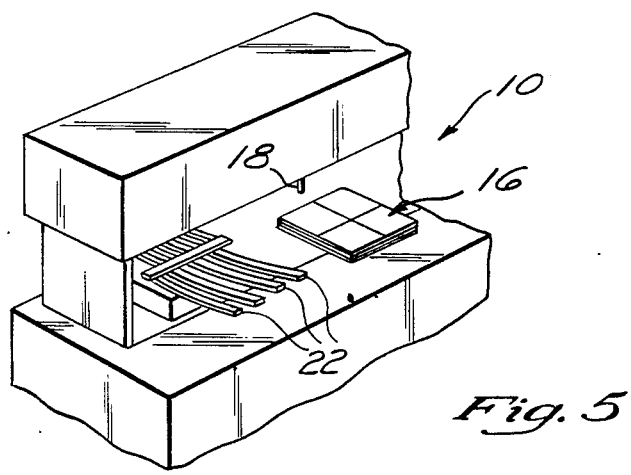
FIG. 5 is a perspective view of a pick and place machine, which can be adapted to incorporate the component cover plate of the present invention.

A computer automated pick and place machine 10 is depicted in FIG. 5. The pick and place machine 10 may, for example, be of the kind manufactured by the assignee of the present invention, Excellon Industries, under the name SMX1. Computer automated pick and place machines of this type are well known in the art and are designed generally to pick up components 12, one at a time from a "pick" station 14, carry the component 12 to a precisely defined second location, a "place" station 16, and place the component onto a precisely defined position on a work piece, for example, a printed circuit board. In general, these pick and place machines employ a vacuum head and chuck tip 18 which attaches the component as a result of a vacuum suction, and is released when the component 12 is moved to the "place" station 16.

Typically, the components 12 to be placed are electronic components, and the work piece a printed circuit board. It is thus crucial that the pick and place machine 10 not only be properly controlled to select a proper part from a selected first location 14, but must also be correctly aligned when attached to the chuck tip 18, such that at the second location 16, the electrical terminals of the component will be properly aligned with the associated mating holes on the printed circuit board.

Preferably, a feed tray 20, as shown in partial cross section in FIG. 1, is employed to feed such components 12 to the pick and place machine 10 so they can be surface mounted on, for example, a printed circuit board. The feed tray 20 is adapted to advance a plurality of components 12 from a plurality of sources 22, disposed at a proximal end 24 of the tray 20, to their respective "pick" stations 14 which are disposed at a distal end 26 of the tray 20. Upon arriving at the distal end 26 of the tray 20, a component 12 will abut a stop plate 28 which serves to hold the component 12 in place until it is lifted from the tray 20 and carried to the "place" station 16.

Figure 3:
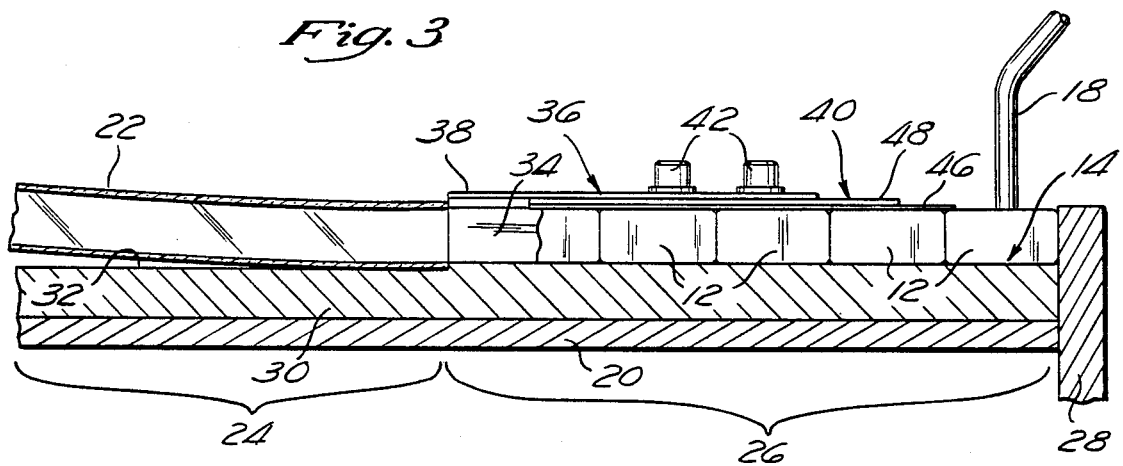
FIG. 3 is a side elevation taken along line 3—3 of FIG. 1.
Figure 4:
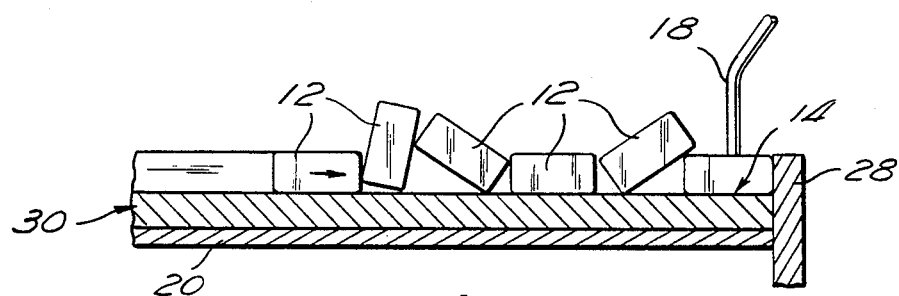
FIG. 4 is a side elevation of a prior art device, showing the "tombstoning" phenomenon, inventively solved by the present invention.

Preferably, each source 22 of components comprises a plastic shipping tube, substantially rectangular in cross section, as shown in FIG. 3. To maintain a steady supply of components 12 to the "pick" station 14, each tube 22 is open-ended and packaged with like components, however, components may vary among tubes.

In order to guide the components 12 to their respective "pick" stations 14, channels or troughs 30 must be provided on the tray 20. Each trough 30 includes an upwardly facing surface 32 upon which the components 12 are guided toward the "pick" station 14, and a pair of aligning walls 34 which serve to center the part 12 within the trough 30. It is critical that each trough 30 be properly dimensioned corresponding to the respective components 12 so that the component 12 is oriented in a predictable fashion when it arrives at the "pick" station 14. If not properly oriented, the component 12 may not be able to be lifted from the "pick" station 14, or, if it is lifted, it will not be placed in the proper orientation on the printed circuit board.

As best seen in FIGS. 1 and 2, a component cover plate 36 is secured to one of the aligning walls 34 of the trough 30. The cover plate 36 includes a washer plate 38 and a slidable cover 40, which is sandwiched between the washer plate 38 and the aligning wall 34 of the trough 30. A pair of bolts 42 extend through apertures 44 in the washer plate 38 and are threaded into holes in the troughs 30 to secure the component cover plate 36 to the trough 30.

Advantageously, the shape of the washer plate 38 is substantially L-shaped. This allows one end to be secured to the aligning wall 34 of the trough 30 and yet enables the perpendicular portion to extend over that part of the trough 30 in which components 12 contained therein would normally be exposed. This extension over the trough 30 prohibits the components 12 from tombstoning as they traverse the upwardly facing surface 32 of the trough 30.

The sliding cover plate 40 is substantially comprised of a flexible flap 46, bonded to a rigid backing plate 48. In the preferred embodiment, the bonding is achieved by an adhesive, for example, Loctite ® brand adhesive. The flexible flap 46 includes a portion which extends beyond the backing plate 48 and at least partially overhangs a component 12 disposed at the pick station 14. Preferably, this extension of the flap 46 which protrudes past the backing plate 48 is 0.15 inches in length.

Advantageously, the flap 46 is sufficiently flexible so as to enable a component 12 at the pick station 14 to be lifted from the trough 30, yet rigid enough to prevent the components 12 within the trough 30 from tombstoning. The flap 46 is preferably made of a thin polyester film. In the preferred embodiment, the film is 0.0015 inches thick.

The backing plate 48 exhibits an elongated linear slot 50, substantially parallel to side of the trough 30 to which it is attached. The slot 50 allows the backing plate 48 and flap 46 to be movable relative to the trough 30 so as to vary the amount of overhang for the various components 12 to be contained with in respective troughs 30. Quick adjustment of the cover plate 36 allows a single component cover plate to be used for a number of various sized components.

Preferably, the washer plate 38 and the backing plate 40 are made of a thin metal material which exhibits a natural bend. In the preferred embodiment, such a metal is beryllium copper, approximately 0.015 inches thick. When mounted on the side of the trough, the metal pieces are positioned such that the natural bend of the material exhibits a concavity in the downward direction.

In operation, components 12 from a plurality of sources 22 are loaded onto the feed tray 20 in respective troughs 30. Preferably, each of the sources 22 of components comprises a plastic shipping tube, substantially rectangular in cross section. Each tube 22 is adapted to be removably inserted into a respective trough 30, and is supported at one end by a tube bracket support (not shown) in an inclined ski-slop manner.

Vibration of the tray 20, as well as the inclined manner in which the tubes 22 are supported causes the components 12 to migrate onto their respective troughs 30. As the components 12 continue to migrate toward the "pick" station 14, they are surrounded by the pair of aligning walls 34 which tend to center the components 12 within the trough 30, as well as by the component cover plate 36 which provides resistance to vertical movement of the components contained therein.

The components 12 continue migrating toward their respective "pick" stations 14 until they abut the stop plate 28 which prevents the components 12 from falling off the end of the trough 30. The orientation of the component 12 positioned at the "pick" station 14 is maintained in a plane parallel to that of the upwardly facing surface 32 of the trough 30 by the flap 46 which at least partially covers one end of the component 12.

As the component 12 is lifted from the trough 30, the flap 46 flexes upwardly so as to enable the vacuum tip 18 of the pick and place machine 10 to remove the part 12 from the trough 30 and subsequently place the part 12 at the proper place station 16. The resistance provided by the flap 46 is not sufficient to overcome the vacuum force which adheres the component 12 to the chuck 28.

It will be understood by those skilled in the art that the component cover plate of the present invention can be adapted for use with any type of machine in which articles being moved from one location to another tend to tombstone. The foregoing detailed description is to be clearly understood as given by way of illustration, the spirit and scope of this invention being limited solely by the appended claims.

What is claimed is:

1. An apparatus for maintaining the orientation of a plurality of electronic components advancing toward a first predetermined location, said components adapted to be singularly lifted from said first predetermined location and moved to a second predetermined location, said apparatus comprising:

a feed tray having a trough, said trough having an upwardly facing surface adapted to provide a path for guiding said components toward said first predetermined location, said components being oriented in said trough in a plane substantially parallel to the plane of said upwardly facing surface;

a stop plate, located at one end of said feed tray, proximate to said first predetermined location, said stop plate adapted to retaining said components on said feed tray until they are subsequently lifted therefrom; and a component cover plate extending across said trough for preventing said components from being canted within said trough, said cover plate comprising:

a flap which is positioned directly above and which at least partially overhangs a component disposed at a first predetermined location, said flap having sufficient flexibility to allow said component to be lifted from said feed tray past said flap, in a direction substantially perpendicular to the direction in which said components advance, yet being rigid enough to prevent canting of a component at said first predetermined location; and a backing plate positioned directly above said flap so as to restrict deflection of said flap.

2. An apparatus for maintaining the orientation of a plurality of electronic components advancing toward a first predetermined location, said components adapted to be singularly lifted from said first predetermined location, said apparatus comprising:

a feed tray having a trough, said trough having an upwardly facing surface adapted to provide a path for guiding said components toward said first predetermined location, said components being oriented in said trough in a plane substantially parallel to the plane of said upwardly facing surface;

a stop plate, located at one end of said feed tray, proximate to said first predetermined location, said stop plate adapted to retaining said components on said feed tray until they are subsequently lifted therefrom; and a component cover plate extending across said trough for preventing said components from being canted within said trough, said cover plate including a flap which at least partially overhangs a component disposed at a first predetermined location, said flap having sufficient flexibility to allow said component to be lifted from said feed tray past said flap, in a direction substantially perpendicular to the direction in which said components advance, yet being rigid enough to prevent canting of a component at said first predetermined location, wherein said flap is adjustable relative to said trough in a direction substantially perpendicular to said upwardly facing surface of said trough so as to vary the amount of overhang over various sized components.

3. An apparatus as defined by claim 1, wherein said flap is bonded to a backing plate.

4. An apparatus as defined by claim 3, wherein said flap protrudes beyond said backing plate.

5. An apparatus as defined by claim 3, wherein said flap extends at least 0.15 inches beyond said backing plate.

6. An apparatus as defined by claim 3, wherein said component cover plate further comprises a washer plate and wherein said backing plate has a slot constructed and arranged to allow said backing plate to slide relative to said washer plate so as to allow quick adjustment of said cover for components of varying sizes.

7. An apparatus for maintaining the orientation of a plurality of components advancing toward a first predetermined location, said components adapted to be singularly lifted from said first predetermined location and moved to a second predetermined location, said apparatus comprising:

a feed tray having a trough, said trough adapted to provide a path for guiding said components toward said first predetermined location;

a slop plate, located at one end of said feed tray, proximate to said first predetermined location, said stop plate adapted to retaining said components on said feed tray until they are subsequently lifted therefrom; and a component cover plate extending across said trough for preventing said components from being canted within said trough, said cover plate comprising:

a substantially L-shaped washer plate; and a slidable cover, sandwiched between said washer plate and a wall of said trough, said slidable cover including a flap which at least partially overhangs a component disposed at said first predetermined location, said flap having sufficient flexibility to allow said component to be lifted from said feed tray, yet being rigid enough to prevent canting of a component at said first predetermined location, said slidable cover further including a backing plate, to which said flap is bonded, said backing plate exhibiting a slot so as to allow quick adjustment of said cover for components of varying sizes.

8. An apparatus as defined by claim 6, wherein said washer plate and said backing plate are made from beryllium copper.

9. An apparatus for maintaining the orientation of a plurality of components advancing toward a first predetermined location, said components adapted to be singularly lifted from said first predetermined location and moved to a second predetermined location, said apparatus comprising:

a feed tray having a trough, said trough adapted to provide a path for guiding said components toward said first predetermined location;

a stop plate, located at one end of said feed tray, proximate to said first predetermined location, said stop plate adapted to retaining said components on said feed tray until they are subsequently lifted therefrom; and a component cover plate extending across said trough for preventing said components from being canted within said trough, said cover plate comprising:

a washer plate; and a slidable cover, sandwiched between said washer plate and a wall of said trough, said slidable cover including a flap which at least partially overhangs a component disposed at said first predetermined location, said flap having sufficient flexibility to allow said component to be lifted from said feed tray, yet being rigid enough to prevent canting of a component at said first predetermined location, said slidable cover further including a backing plate, to which said flap is bonded, said backing plate exhibiting a slot so as to allow quick adjustment of said cover for components of varying sizes, wherein said washer plate and said backing plate are 0.015 inches thick, and exhibit a natural bend having a concavity which faces downwardly.

10. An apparatus as defined by claim 3, wherein said flap and said backing plate are bonded by adhesive.

11. An apparatus as defined by claim 1, wherein said flap is made from a polyester film.

12. An apparatus as defined by claim 11, wherein said polyester film is 0.0015 inches thick.

13. An apparatus as defined by claim 1, wherein said cover plate extends substantially the entire length of said trough along which said components are exposed.

14. In an apparatus for advancing a plurality of components toward a first location, said apparatus including a trough secured to a feed tray, said trough having an upwardly facing surface upon which said components are guided toward said first location, and a stop plate disposed at one end of said feed tray for retaining said components within said trough at said first location an improvement comprising:
   a cover plate for preventing said components from being canted within said trough and maintaining said components in a plane parallel to the plane of said upwardly facing surface of said trough, said cover plate comprising:
   a flap which is positioned directly above and which overhangs one end of a component, disposed at said first location, said flap having a flexibility which allows the component to be lifted from said trough past said flap in a direction substantially perpendicular to the direction in which said components advance, yet being rigid enough to prevent canting of a component at said first location; and
   a backing plate positioned directly above said flap so as to restrict deflection of said flap.

15. A pick and place machine adapted to pick up an electronic component from a respective first predetermined location, carry said component to a precisely defined second predetermined location, and place said component onto a precisely defined position on a printed circuit board at said respective second location, said apparatus comprising:
   a chuck, movable between said respective first predetermined location from which said component is to be taken and said respective second predetermined location to which said component is to be transferred, said chuck having a tip which provides a vacuum for detachably securing said component to said tip;
   a movable worktable, adapted to positioning said printed circuit board relative to said chuck so as to enable said chuck to place said component in the desired location;
   a trough secured to a feed tray, said trough having an upwardly facing surface upon which said components are guided toward said first location, said components being oriented in said trough in a plane substantially parallel to the plane of said upwardly facing trough surface;
   a stop plate for retaining said components within said trough at said first location; and
   a component cover plate extending substantially the entire length of said trough along which said components are exposed and adapted to prevent said components from being canted within said trough, said component cover plate comprising:
   a flap which is positioned directly above and which at least partially covers a component disposed at said first location, said flap having sufficient flexibility to allow said component to be lifted from said trough above said flap, yet being rigid enough to prevent canting of said component when at said first predetermined location; and
   a backing plate positioned directly above said flap so as to restrict deflection of said flap.

* * * * *